(12) United States Patent
Takai

(10) Patent No.: US 7,148,733 B2
(45) Date of Patent: Dec. 12, 2006

(54) VARIABLE DELAY CIRCUIT WITH FASTER DELAY DATA UPDATE

(75) Inventor: Toru Takai, Tokyo (JP)

(73) Assignee: Tektronix International Sales GmbH, Schaffhausen (CH)

( * ) Notice: Subject to any disclaimer, the term of this patent is extended or adjusted under 35 U.S.C. 154(b) by 30 days.

(21) Appl. No.: 11/185,605

(22) Filed: Jul. 19, 2005

(65) Prior Publication Data

US 2006/0017485 A1 Jan. 26, 2006

(30) Foreign Application Priority Data

Jul. 23, 2004 (JP) ............................. 2004-216480

(51) Int. Cl.
*H03H 11/23* (2006.01)
(52) U.S. Cl. ....................... 327/276; 327/261
(58) Field of Classification Search ................ None
See application file for complete search history.

(56) References Cited

U.S. PATENT DOCUMENTS

| | | | | |
|---|---|---|---|---|
| 5,550,514 A | * | 8/1996 | Liedberg | 331/1 A |
| 5,781,056 A | * | 7/1998 | Fujii | 327/276 |
| 5,859,553 A | * | 1/1999 | Drake | 327/276 |
| 6,008,680 A | * | 12/1999 | Kyles et al. | 327/277 |
| 6,320,445 B1 | * | 11/2001 | Barnes | 327/284 |
| 6,445,661 B1 | * | 9/2002 | Wu | 369/59.2 |
| 6,473,455 B1 | * | 10/2002 | Kwon | 375/228 |
| 6,486,716 B1 | * | 11/2002 | Minami et al. | 327/152 |
| 6,518,812 B1 | * | 2/2003 | Sikkink et al. | 327/284 |
| 6,717,479 B1 | * | 4/2004 | Suda | 331/57 |
| 6,906,968 B1 | * | 6/2005 | Kim et al. | 365/194 |

\* cited by examiner

*Primary Examiner*—Timothy P. Callahan
*Assistant Examiner*—Cassandra Cox
(74) *Attorney, Agent, or Firm*—William K. Bucher

(57) ABSTRACT

Delays induced to leading and trailing edges of an input pulse train are updated faster than before. First and second delay paths receive delay data for inducing delays to leading edges and/or trailing edges of an input pulse train. An OR circuit combines the outputs of the delay paths. First and second gates receive the input pulse train and selectively provide the input pulse train to the first and second delay paths independent of the edge position of the input pulse train. A delay time setup circuit generates a CTRL signal for controlling the first and second gates and the loading of the delay data to the first and second delay path. The CTRL signal causes the gates to selectively switch the input pulse train from one delay path to another while the delay data is selectively loaded in the delay path not receiving the input pulse train.

5 Claims, 3 Drawing Sheets

VARIABLE DELAY CIRCUIT WITH FASTER DELAY DATA UPDATE

BACKGROUND OF THE INVENTION

The present invention relates generally to variable delay circuits that apply variable delay times for inducing delays to leading and/or trailing edges of an input pulse train and more particularly to a variable delay circuit that increases the update rate of the delay time.

Digital circuits in electric instruments process pulse trains that are sometimes not ideal because of variation in the timing of the leading and/or trailing edges of the pulses in the pulse train caused by outside noise, etc. The variations in the timing of the leading and/or trailing edges in the pulse train is referred to as jitter in the electronics industry. Therefore, digital circuits have to be designed to work even if the leading edges and/or trailing edges of the pulses have a certain level of jitter. A jitter tolerance test is used to inspect the prototype circuit by providing a jittered pulse train to the circuit to confirm that it works in the presence of a jittered signal.

For the jitter tolerance test, a jittered test signal (pulse train) is necessary. If this test signal is produced by inducing jitter to a normal pulse train (called a reference pulse train hereinafter) that is normally provided to the digital circuit, an effective jitter tolerance test can be conducted by comparing the jittered test signal with the reference pulse train. To induce jitter to the leading and/or trailing edges, delays are provided to the desired edges of the reference pulse train and then the delays are modified continuously.

Japanese patent publication No. H07-95022 discloses how to delay at least one of the leading and trailing edges of a pulse. FIG. 1 shows a block diagram. A buffer 1 receives an input pulse train and provides non-inverted and inverted outputs to respective first and second delay circuits 2 and 3. The first and second delay circuits 2 and 3 receive first and second delay setup signals that independently set-up the delay times of the first and second delay circuits 2 and 3. An AND circuit 4 receives the output of the first delay circuit 2 and the non-inverted output of the buffer 1 to provide the logical product to the S input of an SR flip-flop 6. An AND circuit 5 receives the output of the second delay circuit 3 and the inverted output of the buffer 1 to provide the logical product to the R input of the SR flip-flop 6. Therefore, the signal to the S input of the SR flip-flop 6 determines the timing of the leading edge of an output pulse train of the SR flip-flop 6, and the signal to the R input does the timing of the trailing edge of the output pulse train.

The Japanese patent publication No. H07-95022 discloses specific examples of the first and second delay circuits 2 and 3. One is an analog delay circuit that compares a ramp waveform and a reference voltage to change the delay time. Another is a digital delay circuit that selectively couples a plurality of delay elements. The analog delay circuit can change the delay time seamlessly but may not provide the delay as a user desires because of noise on the ramp waveform. The digital delay circuit may provide the delay time as set by the user but when the delay time is changed dynamically, the following problem may be encountered. If a small delay time is set up after a large delay time, the input pulse of the large delay time remains in some of the delay lines and the input pulse of the small delay time reaches the output of the delay line earlier than the large delay time input pulse, which changes the order of the input pulses or mixes the former and latter pulses. This means that the invention disclosed in Japanese patent publication No. H07-95022 is not suitable for inducing jitter.

Japanese patent application No. 2003-76026 (corresponding to Japanese patent publication No. 2004-236279 and U.S. Publication No. 2004/0135606) discloses a variable delay circuit that solves the problem of the order changing or mixing of pulses. FIG. 2 shows a block diagram of an example of the variable delay circuit the Japanese patent application No. 2003-76026 discloses. A switch 14 receives and selectively provides a reference input pulse train to two delay paths 16 and 18. Delay times are independently set-up for the delay paths 16 and 18 to provide desired delay times to the leading and trailing edges of the reference pulse train. The delay data of first and second delay circuits 22 and 24 are provided to registers (not shown) and loaded from a delay time setup circuit 44 during the pulse train passing through the second delay path 18. Similarly, the delay data of third and fourth delay circuits 34 and 36 are loaded from the delay time setup circuit 44 during the pulse train passing through the second delay path 16. The delay data for the two delay circuits in the respective first and second delay paths 16 and 18 are changed to modify the delay times of the leading and/or trailing edges of the pulse train independently.

The variable delay circuit the Japanese patent application No. 2003-76026 discloses uses a switch controller 12 to control the toggling of the switch 14. The switch controller 12 receives an enable signal from the delay time setup circuit 44 after the end of the delay data loading to the respective delay circuits in one of the first and second delay paths 16 and 18, and then it makes the switch 14 switch the terminal when a leading edge of an input pulse train comes. This process is for changing the delay path to pass the pulse train at a seam of the pulse trains.

If a leading edge of the input pulse train comes around a rising of the enable signal, the output of the switch controller 12 may be metastable because the enable signal from the delay time setup circuit 44 and the input pulse train are not synchronized. To avoid the metastable status, cascaded D flip flops may be used as a synchronization circuit as disclosed in U.S. Pat. No. 5,764,710, for example. Therefore, if a leading edge of the input pulse train arrives soon after the enable signal arrives, the switch 14 cannot be switched and, in the actual operation, there is a waiting time of some leading edges after the enable signal arrives before the switch 14 toggles.

As described above, the variable delay circuit described in Japanese patent application No. 2003-76026 confirms the status of each delay data loading and leading edge of the input pulse train for purposes of toggling the switch 14. The delay time setup circuit 44 detects the status of the delay data loading for the delay paths to provide the enable signal to the switch controller 12, and then the switch controller 12 confirms the leading edge of the input pulse train from the synchronization circuit. The status confirmation based process makes the process speed slow. In other words, because the CPU and the delay time setup circuit 44 are not synchronized with the pulse train, the CPU proceeds with the process to confirm the status of each circuit step by step, or by handshakes. What is needed is a variable delay circuit that provides faster delay data updates increasing the induced jitter throughput of the variable delay circuit.

SUMMARY OF THE INVENTION

The present invention is to a variable delay circuit that increases the update rate of delay data for delay paths. First and second delay paths receive delay data for inducing delays to leading edges and/or trailing edges of an input pulse train. A combining means may have an OR circuit and combines the outputs of the first and second delay paths. A gate means selectively provides the input pulse train to each of the first and second delay paths independent of the edge position of the input pulse train. A control means controls the gate means and loading of the delay data to the first and second delay paths with the gate means being selectively switched to pass the input pulse train to one of the first and second delay paths while the delay data is selectively loaded in the other of the first and second delay path not receiving the pulse train. The gate means further provides the pulse train to both the first and second delay paths for a selected period of time to provide seamless path alternations.

In the variable delay circuit according to the present invention, the control means directly controls the gate means for determining the timing of providing the input pulse train to the first and second delay paths regardless of the status of the input pulse train. That is, the control means is not required to watch the status of the circuits, which makes the delay data update process faster than before.

The objects, advantages and other novel features of the present invention are apparent from the following detailed description when read in conjunction with the appended claims and attached drawings.

DETAILED DESCRIPTION OF THE INVENTION

Figure 1:
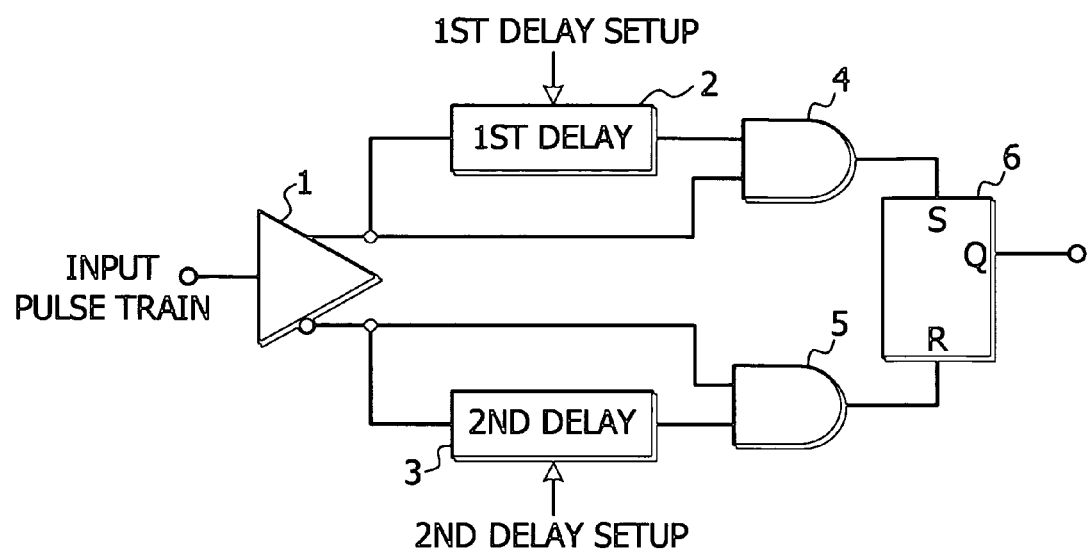
FIG. 1 is a block diagram of a conventional circuit for inducing delay to the leading edges and/or trailing edges of a pulse.
Figure 2:
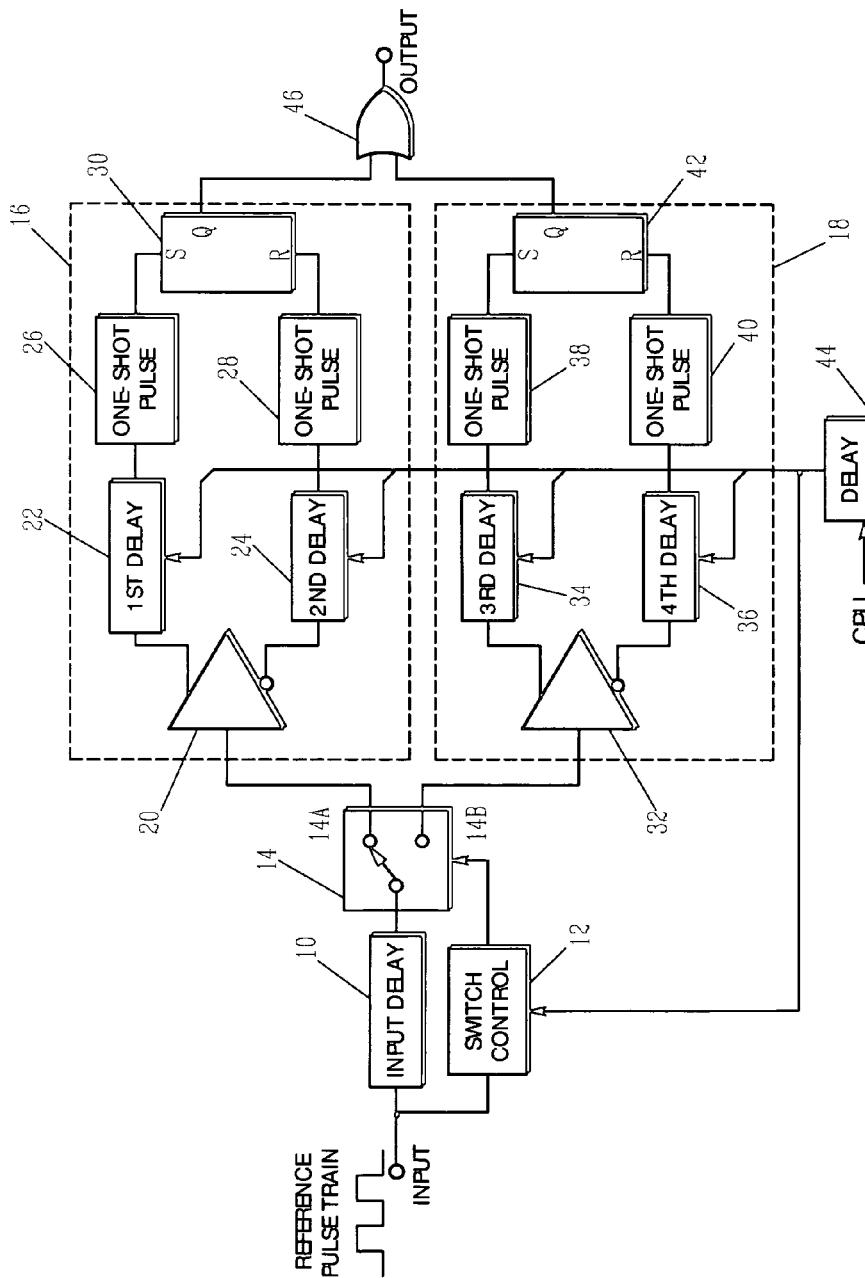
FIG. 2 is a block diagram of a conventional circuit for inducing jitter to the leading edges and/or trailing edges of a pulse train.
Figure 3:
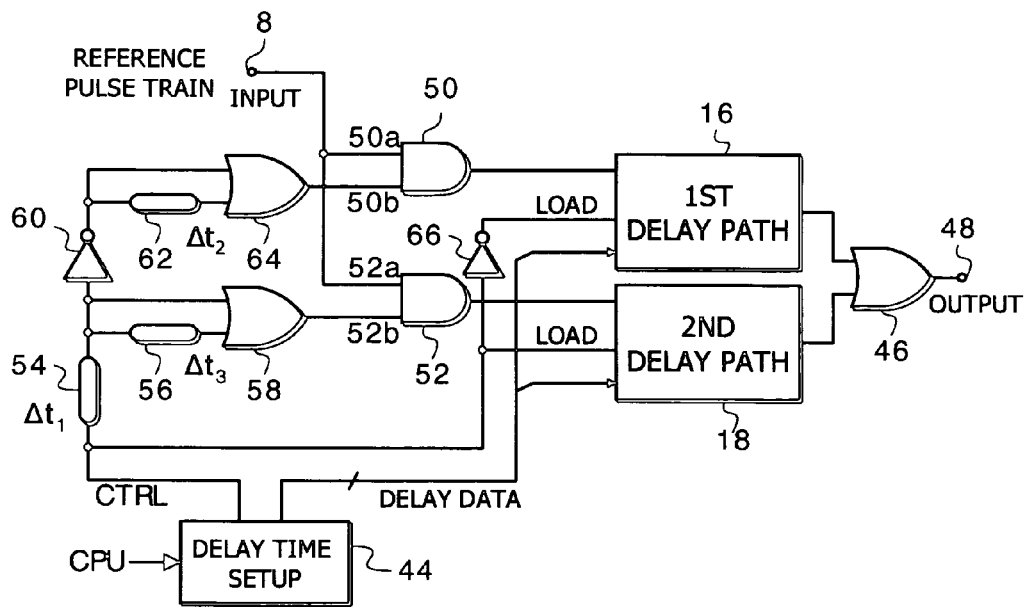
FIG. 3 is a block diagram of a variable delay circuit for inducing jitter to the leading edges and/or trailing edges of a pulse train according to the present invention.

FIG. 3 shows a block diagram of a variable delay circuit according to the present invention. The variable delay circuit is incorporated into a waveform generator having a microprocessor system that includes display, keyboard, mouse, CPU, RAM, etc. and programs stored in memory means such as a hard disk drive though they are not shown. Like circuit blocks from FIG. 2 are labeled the same in FIG. 3.

First and second delay paths 16 and 18 receive delay data with the delay times of leading and trailing edges being set up independently. A reference pulse train from an input terminal 8 is provided to terminals 50*a* and 52*a* of AND circuits 50 and 52 that are coupled to the respective two delay paths 16 and 18. An OR circuit 46 combines or takes a logical sum of the outputs of the first and second delay paths 16 and 18 and provide the output at the output 48.

Figure 4:
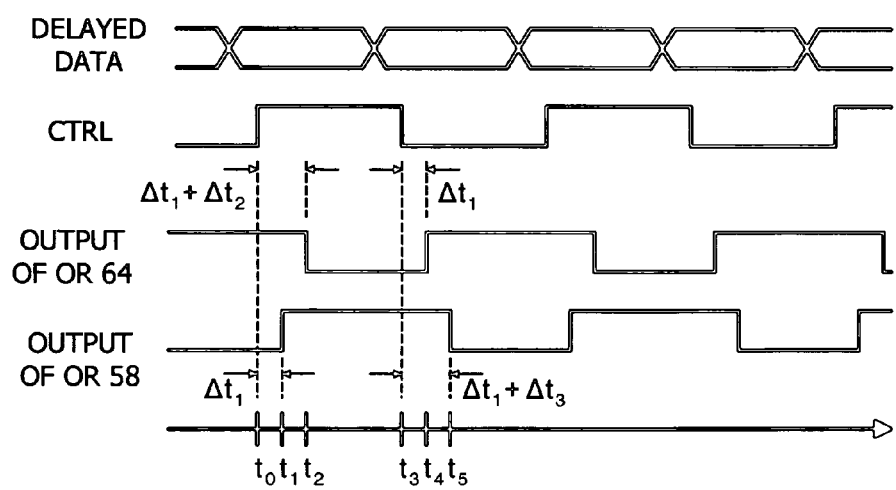
FIG. 4 shows a timing chart of signals of the variable delay circuit according to the present invention.

With the reference pulse train passing through the first delay path 16, the delay time setup circuit 44 provides delay data to the second delay path 18 and changes the logic value of a CTRL signal to 1 (high) from 0 (low) at a point $t_0$ as shown in the timing diagram of FIG. 4. The CTRL signal works as a load signal for the second delay path 18 and the delay data is loaded to the second delay path 18. The CTRL signal is delayed by a given time $\Delta t_1$ by a delay element 54 and provided to an OR circuit 58. The input 52*b* of the AND circuit 52 receives "1" through the OR circuit 58 and then logical values of the reference pulse train at the input 52*a* pass as they are. That is, the AND circuit 52 becomes ON at a point $t_1$ delayed from the point $t_0$ by $\Delta t_1$.

The logical value of the CTRL signal delayed by the delay element 54 by $\Delta t_1$ is inverted by an inverting circuit 60 and provided to one of the inputs of an OR circuit 64 as it is, and a delay element 62 further delays the CTRL signal by $\Delta t_2$ to provide it to the other input of the OR circuit 64. Then, the input 50*b* of the AND circuit 50 receives "0" through the OR circuit 64 at a point $t_2$ delayed from the point $t_0$ by $\Delta t_1$, $\Delta t_2$ and the AND circuit 50 becomes OFF.

After the pulse train remaining in the delay path 16 has passed, or a predetermined amount of time depending on the delay has passed, the delay time setup circuit 44 provides delay data to the first delay path 16 and changes the CTRL signal to "0" from "1" at a point $t_3$. An inverting circuit 66 inverts the CTRL signal that works as a load signal for the first delay path 16 so that the delay data is loaded to the first delay path 16 at the point $t_3$. The CTRL signal is delayed by the delay element 54 by $\Delta t_1$ and inverted by the inverting circuit 60 to make the OR circuit 64 output "1" and the AND circuit 50 becomes ON at a point $t_4$. The CTRL signal delayed by the delay element 54 by $\Delta t_1$ is additionally delayed by a delay element 56 by $\Delta t_3$, which makes both the inputs of the OR circuit 58 "0" and then the AND circuit 52 becomes OFF at a point $t_5$.

As described, the AND circuits 50 and 52 alternately turn ON and OFF with overlap ON times and work as gates to alternately provide the input reference pulse train to the first and second delay paths 16 and 18. Note that the delay time setup circuit 44 can control the ON and OFF of the AND circuits 50 and 52 independent of the input pulse train. That is, the delay time setup circuit 44 can proceed with the process of writing the delay data into each delay circuit of the delay paths independent of the input pulse train. The overlapping ON times of the delay paths are provided to avoid noise or glitches during the delay path change and provide seamless changes between the outputs of the first and second delay paths.

Although the invention has been disclosed in terms of the preferred embodiment disclosed herein, those skilled in the art will appreciate that modifications and improvements may be made without departing from the scope of the invention. For example, there may be three or more delay paths. Each delay path may have programmable delay circuits as shown in FIG. 2, either of a digital or an analog design.

A variable delay circuit according to the present invention can update delay times that induce delays to leading and/or trailing edges of a input pulse train. Therefore, it can generate faster jitter than before and is suitable for faster jitter tolerance test.

What is claimed is:

1. A variable delay circuit comprising:
    a plurality of delay paths receiving delay data for inducing delays to leading edges and/or trailing edges of an input pulse train,
    means for combining outputs of the delay paths;
    gate means for selectively providing the input pulse train to each of the plurality delay paths independent of the edge position of the input pulse train; and means for controlling the gate means and loading of the delay data to the plurality of delay paths with the gate means being selectively switched to pass the input pulse train to one of the plurality of delay paths while the delay data is selectively loaded in one of the plurality of delay paths not receiving the pulse train.

2. The variable delay circuit recited in claim 1 wherein the gate means provides the pulse train to more than one delay path for a selected period of time.

3. The variable delay circuit recited in claim 1 wherein the delays induced to the leading edges and/or trailing edges of the input pulse train induce jitter on the leading edges and/or trailing edges of the input pulse train.

4. The variable delay circuit recited in claim 1 wherein the controlling means provides a control signal to the gate means for selecting which of the plurality of delay paths receives the input pulse train.

5. The variable delay circuit recited in claim 1 wherein the delay path has a programmable delay element for inducing delays to leading edge and/or trailing edge of an input pulse train according to the delay data.

* * * * *